United States Patent [19]
Sato et al.

[11] Patent Number: 5,345,177
[45] Date of Patent: Sep. 6, 1994

[54] MAGNETIC RESONANCE IMAGING APPARATUS HAVING VIBRATION DAMPING MEANS ON GRADIENT COIL

[75] Inventors: Taichi Sato, Ishioka; Yoshiharu Mohri, Ibaraki; Kihachiro Tanaka, Ushiku; Takao Honmei; Masayuki Otsuka, both of Katsuta; Masashi Wada, Hitachi, all of Japan

[73] Assignee: Hitachi, Ltd., Tokyo, Japan

[21] Appl. No.: 32,665

[22] Filed: Mar. 17, 1993

[30] Foreign Application Priority Data

Mar. 18, 1992 [JP] Japan ................................ 4-61855

[51] Int. Cl.$^5$ .............................................. G01V 3/00
[52] U.S. Cl. ........................................ 324/318; 324/319
[58] Field of Search ............... 324/318, 319, 320, 322, 324/307, 309; 128/653.5

[56] References Cited

U.S. PATENT DOCUMENTS

| | | | |
|---|---|---|---|
| 4,639,672 | 1/1987 | Beaumont | 324/318 |
| 4,774,486 | 9/1988 | Moritsu | 324/318 |
| 4,931,760 | 1/1990 | Yamaguchi et al. | 324/319 |
| 4,983,942 | 6/1991 | Benesch | 324/318 |
| 5,237,300 | 8/1993 | Ige et al. | 324/319 |

*Primary Examiner*—Louis Arana
*Attorney, Agent, or Firm*—Antonelli, Terry, Stout & Kraus

[57] ABSTRACT

A magnetic resonance imaging apparatus includes a magnet for generating a static magnetic field, a gradient coil for generating a gradient magnetic field in a measurement space, and a vibration damping means which includes a container and granular material disposed in the container. The vibration damping means is installed with a supporting bolt between the gradient coil and a supporting means. Since the gradient coil is supported at a constant position without any vibration and deformation, the magnetic resonance imaging apparatus generates an accurate image signal without any acoustic noise.

10 Claims, 6 Drawing Sheets

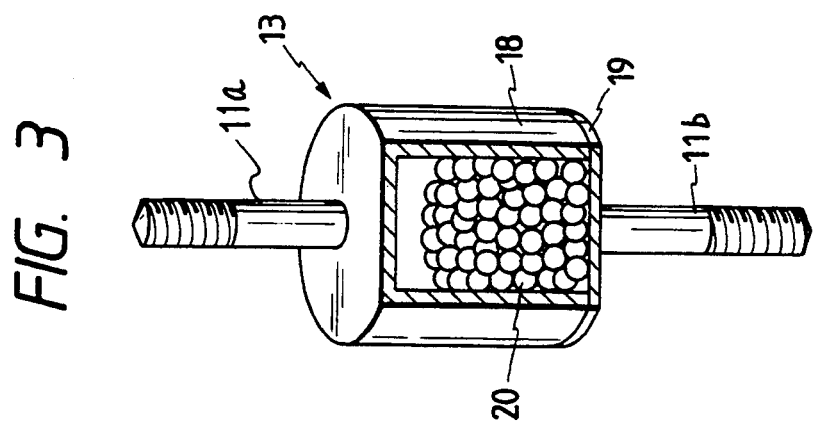
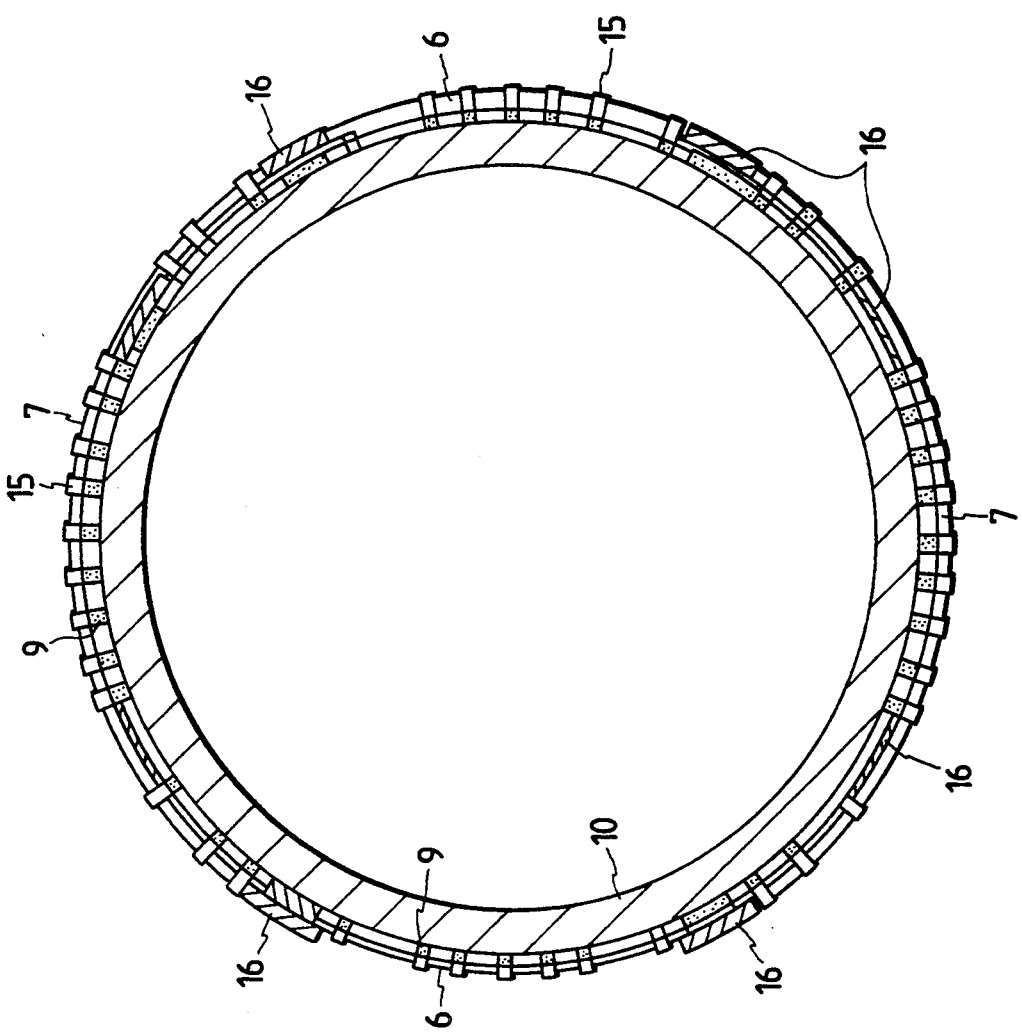

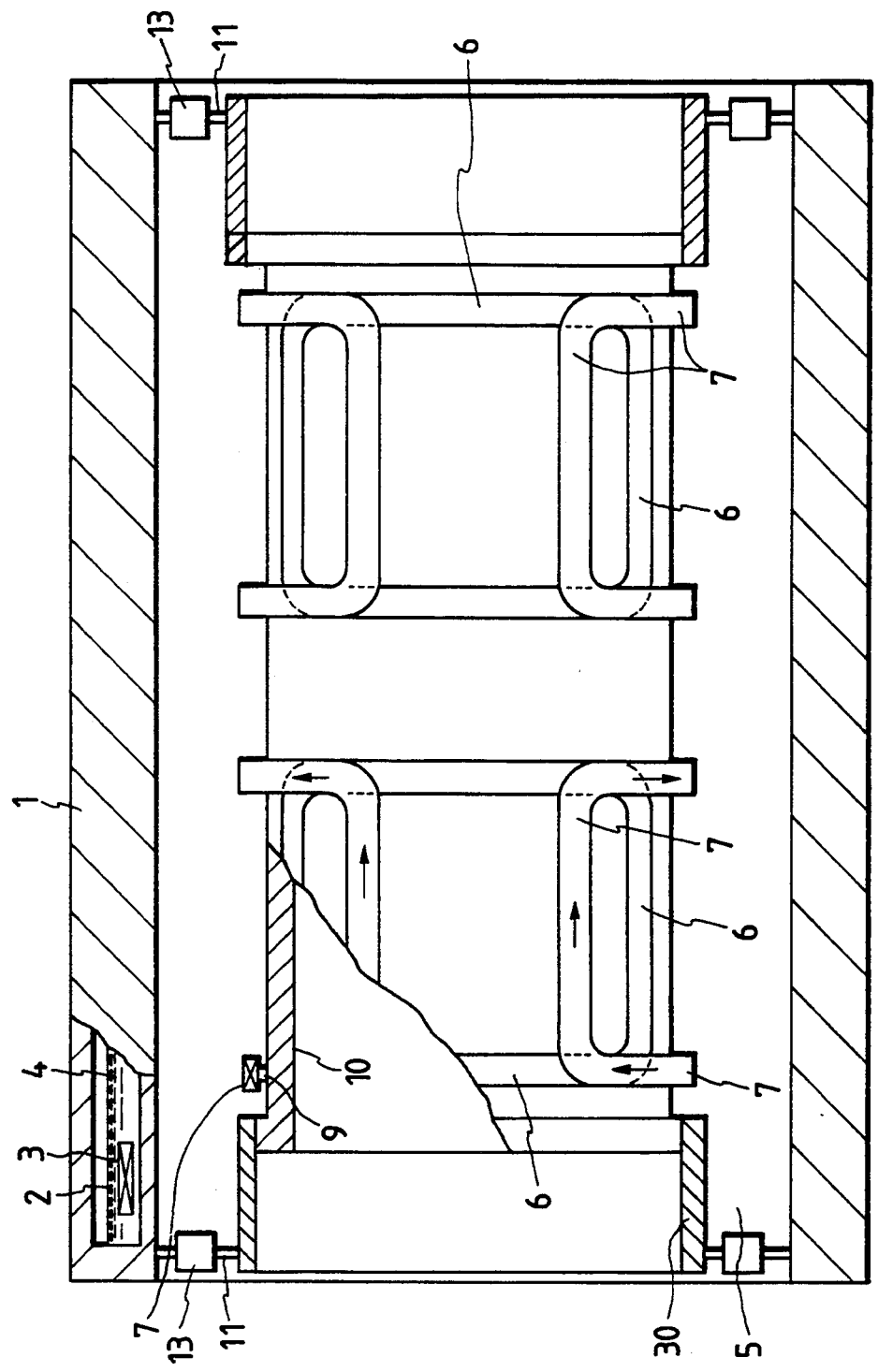

MAGNETIC RESONANCE IMAGING APPARATUS HAVING VIBRATION DAMPING MEANS ON GRADIENT COIL

BACKGROUND OF THE INVENTION

The present invention relates to a magnetic resonance imaging apparatus having a vibration damping means for suppressing a vibration of a gradient coil.

The gradient coils of a magnetic resonance imaging apparatus are usually constructed with plural pairs of saddle shaped coils which are respectively disposed in X and Y directions in a sectional plane perpendicular to a direction of a static magnetic field in a measuring space in which a body to be examined is to be placed, and are generally mounted on a cylindrical bobbin made of epoxy resin having a large elastic modulus via a rubber damper. The gradient coil generates a gradient magnetic field so as to obtain a three dimensional sectional image of the body to be examined.

When a pulse current flows in the gradient coil in order to obtain an image signal, an electromagnetic force is generated on the gradient coil in a direction crossing the static magnetic field and acoustic noise having frequencies from 250 to 8000 HZ is generated by the bobbin which is vibrated by the pulse current flowing in the gradient coil.

In order to suppress the acoustic noise generated by the vibration of the gradient coil in a conventional magnetic resonance imaging apparatus, there is provided a rubber damper between the gradient coil and the bobbin which supports the gradient coil in order to decrease the transmission of the noise from the gradient coil to the bobbin. Examples of such a device are disclosed in European Patent Publication No. 0 350 640 and International Publication No. WO 86/07459.

To a certain extent, such a rubber damper can suppress the generation of the noise which is mainly generated at the bobbin for supporting the gradient coil or at a cryostat device for generating the static magnetic field to which is transmitted the vibration from the gradient coils.

But, since the rubber damper is soft in order to act as a cushion for absorbing the noise and thereby permits the gradient coil to move, this causes a serious problem in as that the electromagnetic force caused by the pulse current deforms the gradient coil and makes it impossible to obtain an accurate image signal.

Furthermore, such a rubber damper cannot decrease the acoustic noise generated by the bobbin to a sufficiently low level because the static magnetic field has ben greatly strengthened recently and the electromagnetic force generated in the gradient coil makes the bobbin vibrate violently.

Summary of the Invention

The present invention has been accomplished to overcome the above mentioned problems of the conventional technique.

An object of the present invention is to provide a magnetic resonance imaging apparatus having a gradient coil which is effectively damped so as not to be vibrated and not to be deformed in order to obtain an accurate image of the body to be examined and so as to suppress noise, too.

In order to attain the above object, the present invention is characterized in that a magnetic resonance imaging apparatus having a magnet for generating a static magnetic field and a gradient coil for generating a gradient magnetic field in a measurement space has a vibration damping means which damps the gradient coil itself so as not to be deformed. The vibration damping means is provided directly on the gradient coil such as a coil molded from an epoxisy resin or through a bobbin on which the gradient coil is supported. Further, said vibration damping means may be provided between the gradient coil and a member such as a supporting member of the magnetic resonance imaging apparatus, the cryostat or a shielding member around the cryostat. Said damping means is constructed with granular material, a container thereof having at least a flexible part and accommodating said granular material, and a supporting member provided on the flexible part.

Furthermore, the present invention includes a magnetic resonance imaging apparatus having a vibration damping means being constructed with plural granular material, a container having two flexible parts and accommodating said granular material, and two supporting members respectively provided on the flexible parts and respectively connected to the gradient coil and the supporting means.

The vibration damping means as stated above effectively suppresses not only deformation of the gradient coil so as to obtain an accurate image, but the noise generated by the gradient coil or by a means for supporting the gradient coil such as a bobbin.

BRIEF DESCRIPTION OF THE DRAWINGS

FIG. 2 is a sectional view of a gradient coil and a bobbin which supports the gradient coil of the magnetic resonance imaging apparatus in the present invention.

FIG. 3 is a schematic view which shows an embodiment of a vibration damping means used in a magnetic resonance imaging apparatus in the present invention.

FIG. 7 is a sectional view which shows another embodiment of a magnetic resonance imaging apparatus in the present invention.

DETAILED DESCRIPTION OF THE PREFERRED EMBODIMENT

A sectional view of an embodiment of a magnetic resonance imaging apparatus in the present invention except for an outer cylindrical shielding vessel and a cryostat device is described below by referring to FIG. 1. Further, FIG. 2 shows a sectional view of a bobbin and a gradient coil wound thereon.

Figure 1:
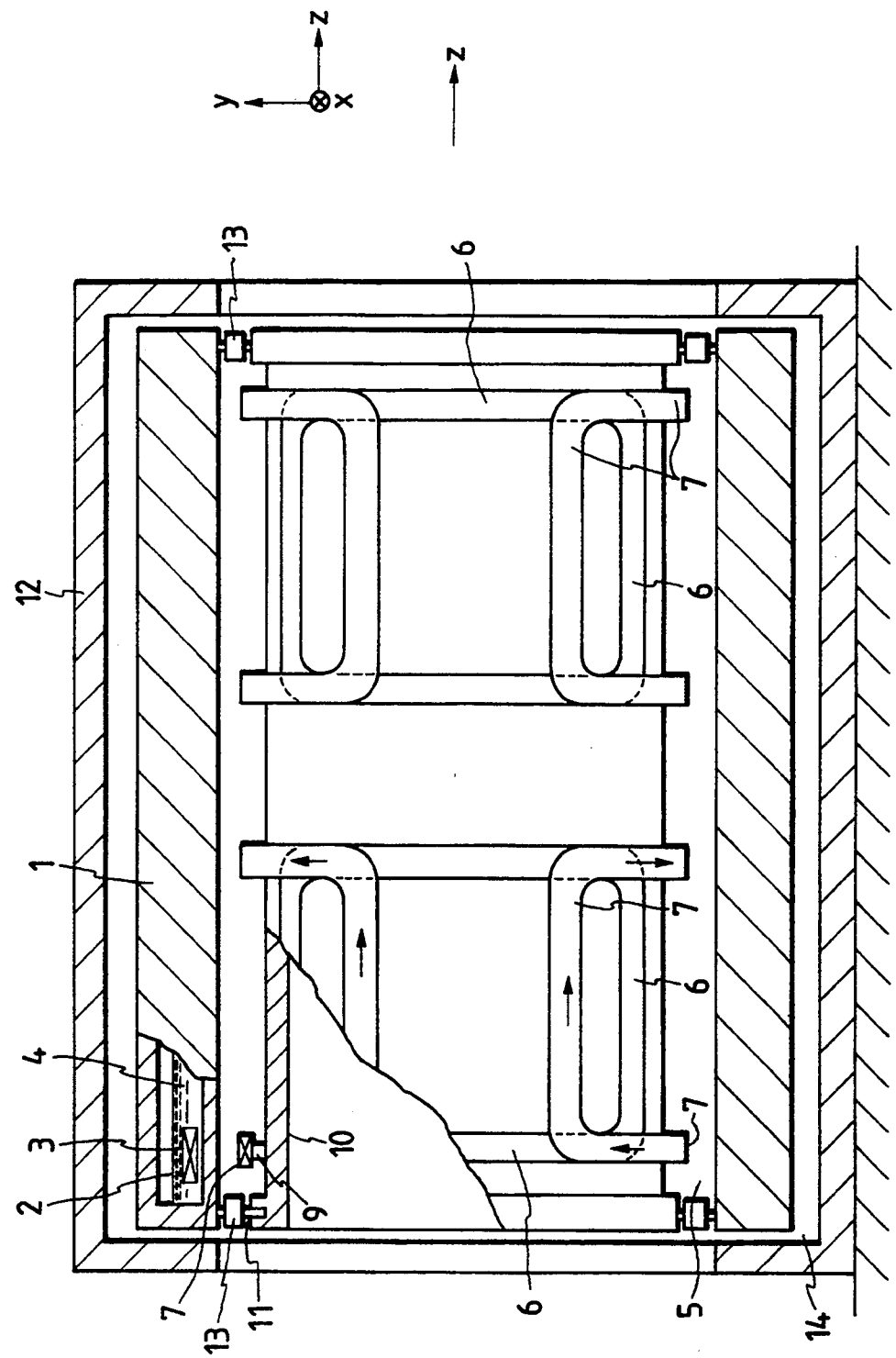
FIG. 1 is a sectional view which shows an embodiment of a magnetic resonance imaging apparatus in the present invention.

In FIG. 1, a cryostat device 1 has a vessel 2 therein filled with liquid helium 4 and is kept in an adiabatic state with a vacuum. A super conducting magnet 3 for generating a static magnetic field in an inside space 5 of the cryostat device 1 is disposed in the vessel 2. The superconducting magnet 3 is cooled by the liquid helium 4 and generates a static magnetic field of 0.5 to 4 tesla in a Z direction, that is, a direction of a central axis of the cryostat 1. A gradient coil 6 generates a gradient magnetic field in a X direction and a gradient coil 7 generates a gradient magnetic field in a Y direction. A gradient coil for generating a gradient magnetic field in the Z direction is not shown in FIG. 1, but is provided in the present invention. These gradient coils are shaped like a saddle and are fixed on a bobbin 10 through plural hard dampers 9 having a very high stiffness. The damper 9 is made of hard rubber a, high polymer chemical compound resin, metal or so forth.

Both ends of the bobbin 10 are supported within the cryostat 1 through vibration damping means 13 having a supporting bolt 11. The gradient coils 6, 7 fixed on the bobbin 10 are adapted to be disposed at a suitable constant position in the inside space 5 by using the supporting bolt 11 so as to fix the coil at the suitable constant position. Around the cryostat 1, a magnetic shielding body 12 having a weight of several tons is provided in order to suppress magnetic field leakage.

When a pulse current for generating the gradient magnetic field flows in the gradient coil 7, an electromagnetic force is generated on the coil 7 and acts to vibrate the coil 7 towards the inside or outside direction of the coil 7 based on Fleming's Left-hand Rule. With respect to the gradient coil 6, an electromagnetic force acts to vibrate the coil 6 in the same way.

The electromagnetic forces as stated above are so strong that they act to deform the saddle shaped gradient coils and make it impossible to obtain an accurate image signal because the gradient magnetic field generated by the deformed gradient coils is non-linear.

In the embodiment of the present invention, the gradient coils 6 and 7 are firmly fastened on the bobbin 10 through hard dampers 9 by using fitting members 15, 16 as shown in FIG. 2.

These dampers 9 are so hard that the gradient coils are firmly fixed on the bobbin 10, and the deformation of the gradient coil is suppressed to a very small range which make it possible to obtain an accurate image signal from the magnetic resonance imaging apparatus.

At the same time, a suitable damping effect of the dampers 9 prevents the bobbin 10 from generating acoustic noise caused by transmission of the vibration from the gradient coils as is known.

But recently, the static magnetic field generated by the superconducting magnet 3 becomes so strong that it becomes impossible to suppress vibration of the bobbin and the deformation of the gradient coils to sufficiently low levels.

Therefore, in the embodiment of the present invention, vibration damping means 13 are provided on the bobbin 10 with supporting bolts 11 in order to suppress the vibration of the bobbin 10 and at the same time prevent deformation of the gradient coils 6, 7.

On both ends of the damping means 13, there are provided supporting bolts 11a, 11b as shown in FIG. 3.

The damping means 13 are respectively fixed on both ends of the bobbin 10 which firmly supports the gradient coils so as not to be deformed by using one of the supporting bolts 11a, 11b, and the other of the bolts is fixed to an inside wall of the cryostat 1.

Thereby, a central axis of a cylindrical body composed by the gradient coils 6, 7 is adjusted so as to be positioned at a suitable position inside the cryostat 1.

Further, outside of the cryostat 1, magnetic shielding body 12 made of iron material is provided in order to make the leakage area of the magnetic field mainly generated by the superconducting magnet 3 small.

Alternatively, the gradient coils 6, 7 may be firmly molded from a high polymer chemical compound resin so as to suppress the deformation of the gradient coils and the vibration damping means 13 may be provided on a molded body of the gradient coils 6, 7 in order to suppress vibration of the molded body.

As stated in the above embodiments, the gradient coils 6, 7 are firmly fixed on the bobbin 10 or are firmly molded in order to suppress the deformation of the gradient coils, and at the same time, the bobbin 10 or the molded body of the gradient coils 6, 7 is provided with the vibration damping means 13 thereon in order to suppress the acoustic noise generated from the bobbin 10 or the molded body.

In FIG. 3, a detail of construction of the vibration damping means 13 is shown. The vibration damping means 13 is constructed with a cylindrical body 18 having a top end on which a supporting bolt 11a is provided, granular material 20 is accommodated in the cylindrical body 18 and a cover 19 is provided on a bottom end of the cylindrical body 18. The cylindrical body 18 and the cover 19 form a container for accommodating the granular material 20. A supporting bolt 11b is provided at the center of the cover 19.

The granular material 20 is made of lead in this embodiment. But other materials such as non-magnetic metal or a ceramic may be used to make the granular material 20. Concerning the weight of the granular material 20, the heavier the better. The cylindrical body 18 is made of a non-magnetic materials such as ceramic.

Figure 4:
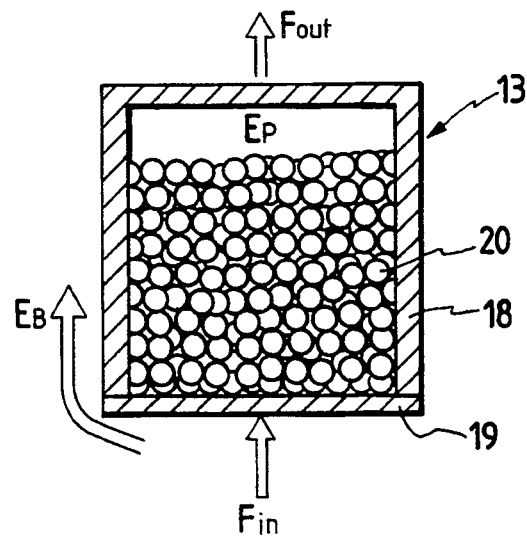
FIG. 4 is a schematic view which shows a flow of a vibrating energy in the vibration damping means of the present invention.

FIG. 4 shows a schematic view for explaining a flow of a vibrating energy. The vibrating force $F_{in}$ transmitted from the bobbin 10 through the supporting bolt 11b connected to the bobbin 10 is applied to the center of the cover 19 and is divided into a vibrating energy $E_B$ which transmitted through the cylindrical body 18 and a vibrating energy $E_P$ which is transmitted to the granular material 20. In the embodiment of the present invention, almost all of the vibrating force $F_{in}$ is converted into the vibrating energy $E_P$ because the cover 19 is flexible and almost all of the vibrating force $F_{in}$ is absorbed by the granular material 20 so as to be converted to collision or friction energy in the granular material 20. Therefore, an output energy $E_{out}$ transmitted from a center of the top end of cylindrical body 18 through the supporting bolt 11a becomes sufficiently small.

Figure 5A:
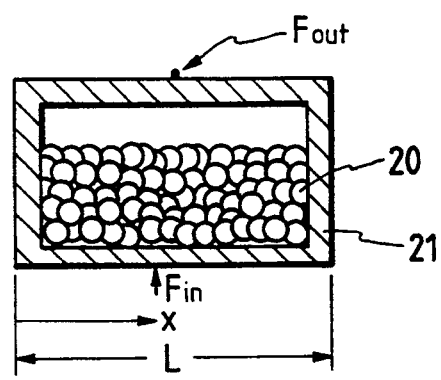
FIGS. 5A-5B are schematic views which show a relation between an output energy transmitted by the vibration damping means in the present invention and a position of a supporting bolt of the vibration damping means to which a vibrating energy is applied.
Figure 5B:
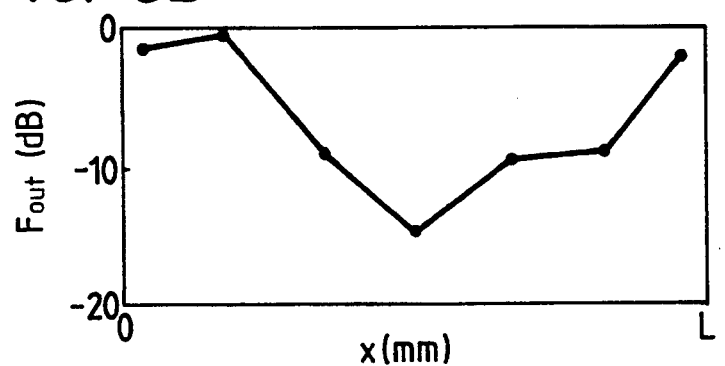

FIGS. 5A–5B are schematic views which show a relation between a position X of the supporting bolt 11b and the output energy $E_{out}$. As apparent from FIGS. 5A–5B, when the supporting bolts 11b is positioned at the center of the cover 19, the output force $F_{out}$ becomes the smallest. Therefore, the supporting bolt 11b should be positioned at the center of the cover 19.

Figure 6:
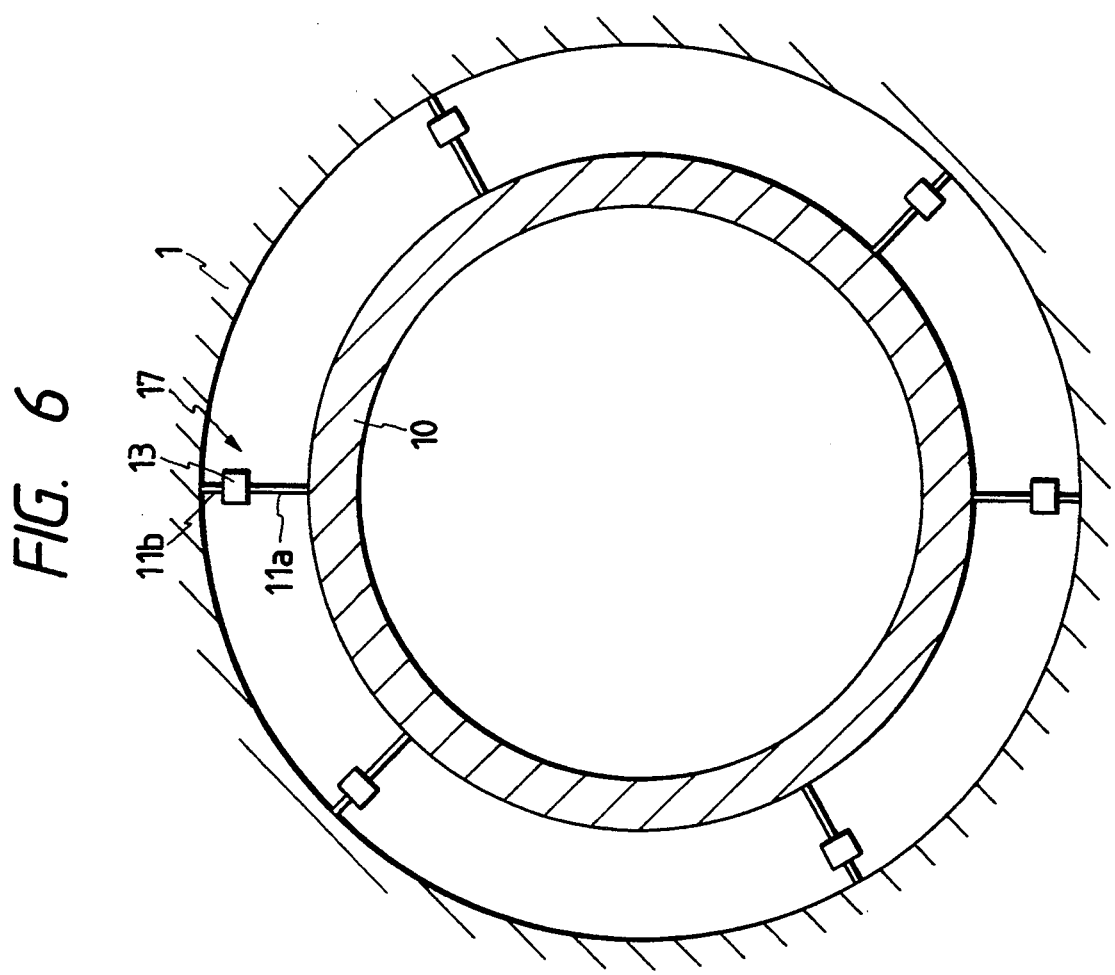
FIG. 6 is a schematic view which shows an embodiment of an arrangement of the vibration damping means.

FIG. 6 is a schematic view which shows an arrangement of the vibration damping means 13. In this embodiment, some of the vibration damping means 13 are installed so as to be inclined. Such inclined vibration damping means are shown in FIG. 10 in more detail.

Figure 10:
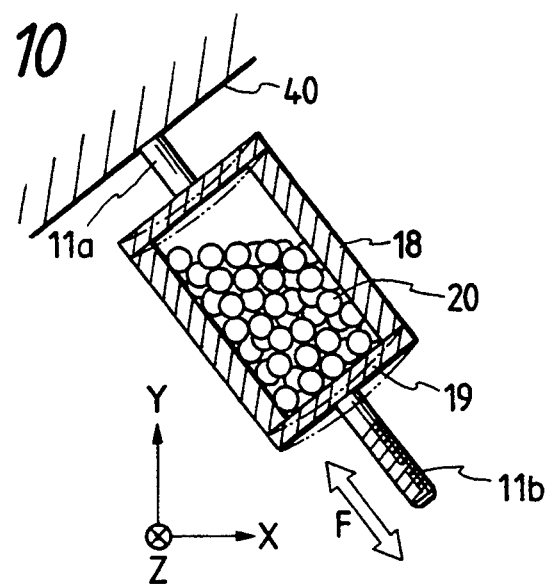
FIG. 10 is a schematic view for showing a function of the vibration damping means in the present invention.

In FIG. 10, a vibrating force F is transmitted to the bottom cover 19 through the lower supporting bolt 11b from the bobbin which is not shown in the figure, and the cover 19 flexs as shown by the two-dot line in FIG. 10.

Almost all of the energy of the vibrating force F is absorbed by the granular material 20 so as not to vibrate the lower supporting bolt 11b and the bobbin connected thereto. The top portion of the cylindrical body 18 can flex as shown by the two-dot line in FIG. 10 if the vibrating force F is transmitted to the top end of the cylindrical body 18. But, since the vibrating energy is absorbed by the granular material 20, the vibrating energy is not transmitted to the top end of the cylindrical body 18 and the upper supporting bolt 11a connected to a supporting member 40 is not vibrated.

The, top portion of the granular materials 20 should not touch the top end of the cylindrical body 18, that is, there must be sufficient empty room at a top inside area of the cylindrical body 18. If the top portion of the granular material 20 touchs the top end of the cylindrical body 18 on which the upper supporting bolt 11a is mounted the vibrating force F from the supporting bolt 11b is directly transmitted to the supporting bolt 11a mounted on the top end of the cylindrical body 18 and the output force from the top end becomes very large. Therefore, the top portion of the granular material 20 should not touch the top end of the cylindrical body 18 when the vibration damping means is installed on the bobbin of the gradient coils or the molded body of the gradient coils.

The top end of the cylindrical body 18 may be flexible in the same way as the cover 19 of the cylindrical body shown in FIG. 3. That is, a flexible cover may also be provided at the top end. Such a vibration damping means having a flexible cover on the top and bottom ends of the cylindrical body 18 is very convenient because it can be easily used without the annoyance of having to distinguish between the top and the bottom of the body 18.

FIG. 7 is a sectional view which shows another embodiment of a magnetic resonance imaging apparatus in the present invention. The gradient coil 7 is fixed on the bobbin 10 through the hard damper 9 and the bobbin 10 is mounted on the cryostat 1 through the vibration damping means 13 by the supporting bolt 11.

Figure 8:
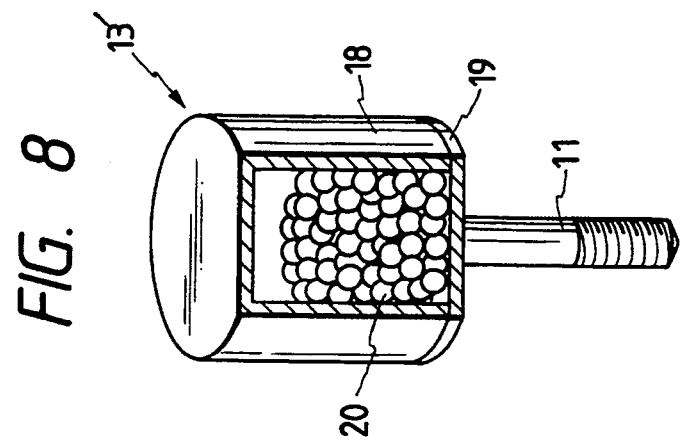
FIG. 8 is a schematic view which shows another embodiment of a vibration damping means used in a magnetic resonance imaging apparatus in the present invention.

FIG. 8 is another embodiment of the vibration damping means 13' in the present invention. The granular material 20 is enclosed in the cylindrical body 18 having a closed end and the open end of the body 18 is closed by the cover 19 in the same way as the vibration damping means 13. But a supporting bolt 11 is provided only on the cover 19. The best position for the supporting bolt 11 is at the center of the cover 19.

Figure 9:
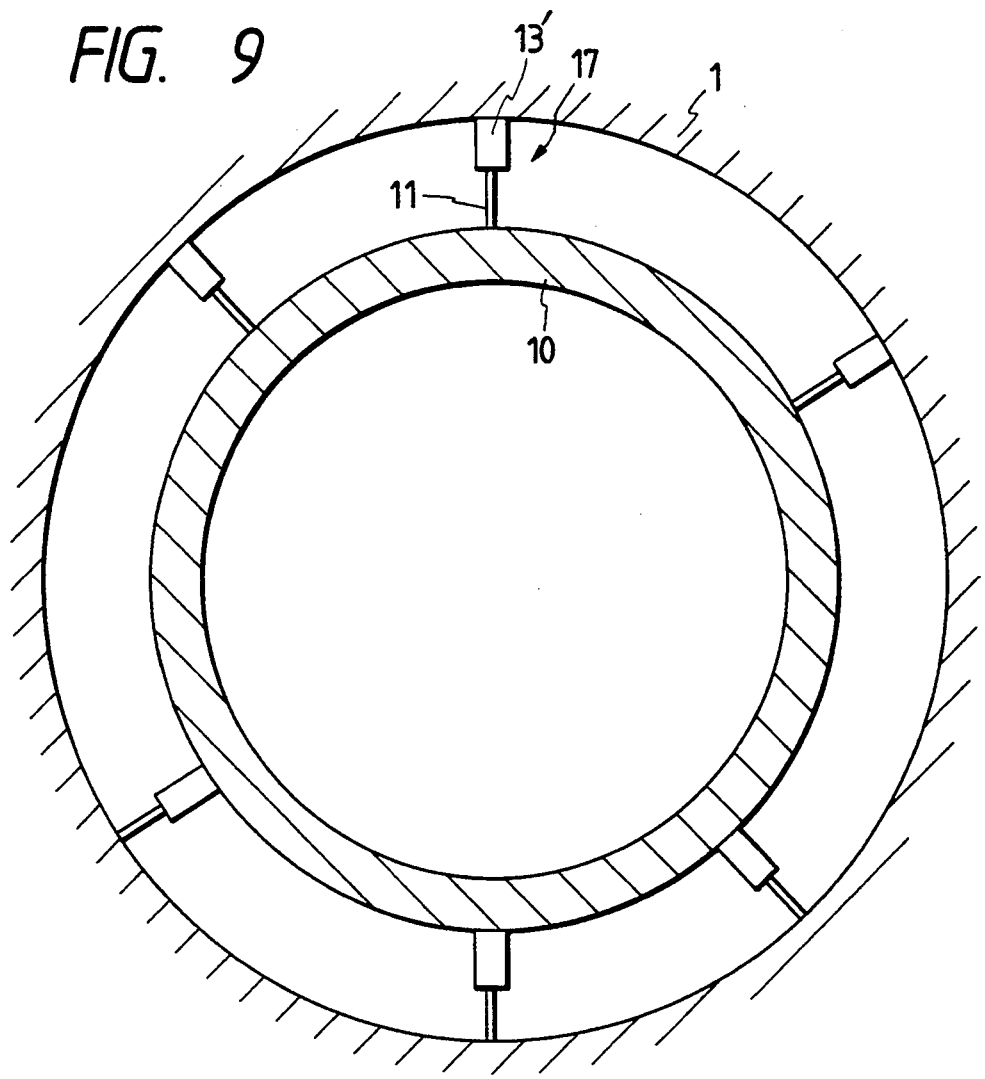
FIG. 9 is a schematic view which shows an embodiment of an arrangement of the vibration damping means shown in FIG. 8.

Such vibration damping means 13' are mounted between the cryostat 1 and the bobbin 10 on which the gradient coils are mounted through the hard dampers as shown in FIG. 9. The vibration damping means are installed so that the top end of the cylindrical body 18 is always disposed upward and the supporting bolt 11 connected to the center of the flexible cover 19 is disposed downward. The top end of the cylindrical body 18 is directly connected to the cryostat 1 or the bobbin 10. In this vibration damping means 13', there must be a sufficiently empty space at the top inside of the body 18 so that the granular material 20 does not touch the top end of the body 18.

As stated above in the present invention, since the vibration damping means 13, 13' has a suitable stiffness and suppresses the vibration of the gradient coils, the gradient coils 6, 7 are supported at a predetermined constant position in the static magnetic field without vibrated and being deformed so that a magnetic resonance imaging apparatus which generates an accurate image signal without generating acoustic noise is provided.

We claim:

1. A magnetic resonance imaging apparatus comprising:
    a magnet for generating a static magnetic field in a measurement space in which a body to be examined is to be placed;
    a gradient coil assembly for generating a gradient magnetic field in the measurement space;
    support means for supporting the gradient coil assembly; and
    vibration damping means disposed between the gradient coil assembly and the support means for damping vibrations from the gradient coil assembly, the vibration damping means including
    a container having a first flexible part,
    granular material disposed in the container, and
    a first supporting member provided on the first flexible part and connected to one of the gradient coil assembly and the support means.

2. A magnetic resonance imaging apparatus according to claim 1, wherein the first flexible part is a lower part of the container and is in contact with the granular material, and wherein an upper part of the container opposing the first flexible part is not in contact with the granular material.

3. A magnetic resonance imaging apparatus according to claim 1, wherein the container also has a second flexible part, and wherein the vibration damping means further includes a second supporting member provided on the second flexible part and connected to one of the gradient coil and the support means to which the first supporting member is not connecting.

4. A magnetic resonance imaging apparatus according to claim 1, wherein the gradient coil assembly includes a gradient coil and a bobbin for supporting the gradient coil, and wherein the first supporting member is connected to the bobbin.

5. A magnetic resonance imaging apparatus according to claim 4, wherein the gradient coil assembly further includes a damper disposed between the gradient coil and the bobbin.

6. A magnetic resonance imaging apparatus according to claim 1, wherein the gradient coil assembly includes a gradient coil having a molded body, and wherein the first supporting member is connected to the molded body.

7. A magnetic resonance imaging apparatus according to claim 1, wherein the magnet has an inside wall, and wherein the support means is the inside wall of the magnet.

8. A magnetic resonance imaging apparatus according to claim 1, further comprising a cryostat having an inside wall, wherein the magnet is disposed in the cryostat, and wherein the support means is the inside wall of the cryostat.

9. A magnetic resonance imaging apparatus according to claim 1, wherein the support means includes magnetic shielding means for shielding the magnet to prevent the static magnetic field from leaking out of the measurement space.

10. A magnetic resonance imaging apparatus according to claim 1, wherein the support means also supports the magnet.

* * * * *